(12) United States Patent
Kim et al.

(10) Patent No.: US 12,183,704 B2
(45) Date of Patent: Dec. 31, 2024

(54) SEMICONDUCTOR PACKAGE AND METHOD FOR MANUFACTURING THE SAME

(71) Applicants: NEPES CO., LTD., Chungcheongbuk-do (KR); NEPES LAWEH CORPORATION, Chungcheongbuk-do (KR)

(72) Inventors: Byung Cheol Kim, Incheon (KR); Yong Tae Kwon, Chungcheongbuk-do (KR); Hyo Gi Jo, Chungcheongbuk-do (KR); Dong Hoon Oh, Chungcheongbuk-do (KR); Jae Cheon Lee, Chungcheongbuk-do (KR); Hyung Jin Shin, Chungcheongbuk-do (KR); Mary Maye Melgo Galimba, Cavite (PH)

(73) Assignees: NEPES CO., LTD., Chungcheongbuk-do (KR); NEPES LAWEH CORPORATION, Chungcheongbuk-do (KR)

( * ) Notice: Subject to any disclaimer, the term of this patent is extended or adjusted under 35 U.S.C. 154(b) by 217 days.

(21) Appl. No.: 17/524,720

(22) Filed: Nov. 11, 2021

(65) Prior Publication Data
US 2022/0148993 A1    May 12, 2022

(30) Foreign Application Priority Data

Nov. 11, 2020 (KR) .................... 10-2020-0150517
Nov. 23, 2020 (KR) .................... 10-2020-0158060
Nov. 4, 2021  (KR) .................... 10-2021-0150898

(51) Int. Cl.
*H01L 23/48* (2006.01)
*H01L 21/48* (2006.01)
(Continued)

(52) U.S. Cl.
CPC .......... *H01L 24/16* (2013.01); *H01L 21/4857* (2013.01); *H01L 21/486* (2013.01);
(Continued)

(58) Field of Classification Search
CPC ....... H01L 23/28; H01L 23/481; H01L 24/33; H01L 2224/16235
(Continued)

(56) References Cited

U.S. PATENT DOCUMENTS 5,619,070 A * 4/1997 Kozono ............ H01L 23/3121
                                                257/E23.125
6,657,282 B2 * 12/2003 Fukasawa ........... H01L 23/562
                                                257/E29.022
(Continued)

FOREIGN PATENT DOCUMENTS

JP   2020101706   7/2020
KR   20160100230  8/2016
(Continued)

OTHER PUBLICATIONS

Office Action of Korea Counterpart Application, Application No. 10-2021-0150898, with English translation thereof, Issued on Dec. 1, 2022, pp. 1-15.

(Continued)

*Primary Examiner* — Nitin Parekh
(74) *Attorney, Agent, or Firm* — JCIPRNET

(57) ABSTRACT

Provided is a semiconductor package including a first semiconductor chip having a bottom surface adjacent to a first active layer and an top surface opposite to the bottom surface; a first adhesive layer disposed on the top surface of the first semiconductor chip; a first conductive stud disposed on the bottom surface of the first semiconductor chip and electrically connected to the first active layer; a first conductive post disposed outside the first semiconductor chip; a (Continued)

redistribution structure disposed under the first semiconductor chip and including a redistribution pattern connected to the first conductive stud and the first conductive post and a redistribution insulation layer surrounding the redistribution pattern; and a molding layer surrounding the first semiconductor chip, the first adhesive layer, the first conductive stud, and the first conductive post on the redistribution structure. Also, a top surface of the molding layer, a top surface of the conductive post, and a top surface of the first adhesive layer may be coplanar.

6 Claims, 28 Drawing Sheets

(51) Int. Cl.
*H01L 21/56* (2006.01)
*H01L 23/00* (2006.01)
*H01L 23/31* (2006.01)
*H01L 23/498* (2006.01)
*H01L 25/16* (2023.01)

(52) U.S. Cl.
CPC ........ *H01L 21/565* (2013.01); *H01L 23/3128* (2013.01); *H01L 23/481* (2013.01); *H01L 23/49816* (2013.01); *H01L 23/49822* (2013.01); *H01L 23/49838* (2013.01); *H01L 24/32* (2013.01); *H01L 25/16* (2013.01); *H01L 2224/16235* (2013.01); *H01L 2224/32145* (2013.01); *H01L 2224/32227* (2013.01); *H01L 2224/32238* (2013.01)

(58) Field of Classification Search
USPC .......................................... 257/797, 787, 783
See application file for complete search history.

(56) References Cited

U.S. PATENT DOCUMENTS

| | | | |
|---|---|---|---|
| 8,310,069 B2 * | 11/2012 | Ano | ........................ H01L 24/83 |
| | | | 257/702 |
| 9,589,903 B2 | 3/2017 | Chen et al. | |
| 9,589,936 B2 | 3/2017 | Zhai et al. | |
| 9,601,471 B2 | 3/2017 | Zhai et al. | |
| 10,050,004 B2 | 8/2018 | Scanlan et al. | |
| 10,468,355 B2 | 11/2019 | Wu et al. | |
| 11,177,142 B2 | 11/2021 | Huang et al. | |
| 2006/0255471 A1 * | 11/2006 | Lee | ........................ H01L 23/562 |
| | | | 257/E23.092 |
| 2012/0196406 A1 * | 8/2012 | Pendse | .............. H01L 23/49811 |
| | | | 257/E21.502 |
| 2013/0307140 A1 * | 11/2013 | Huang | ................ H01L 23/3128 |
| | | | 257/737 |
| 2014/0091455 A1 * | 4/2014 | Strothmann | ............ H01L 24/97 |
| | | | 257/734 |
| 2014/0183731 A1 | 7/2014 | Lin et al. | |
| 2015/0348928 A1 * | 12/2015 | Co | .................... H01L 23/49833 |
| | | | 438/126 |
| 2016/0118333 A1 * | 4/2016 | Lin | ..................... H01L 21/6836 |
| | | | 257/773 |
| 2016/0240465 A1 | 8/2016 | Chen | |
| 2017/0084576 A1 * | 3/2017 | Yu | .......................... H01L 21/56 |
| 2017/0098629 A1 | 4/2017 | Liu et al. | |
| 2018/0108638 A1 * | 4/2018 | Lin | ....................... H01L 23/481 |

FOREIGN PATENT DOCUMENTS

| | | |
|---|---|---|
| KR | 20160111308 | 9/2016 |
| KR | 20170048439 | 5/2017 |
| KR | 20170141733 | 12/2017 |
| KR | 20180084878 | 7/2018 |
| KR | 20190068469 | 6/2019 |
| KR | 20200050452 | 5/2020 |
| TW | 201714264 | 4/2017 |

OTHER PUBLICATIONS

Office Action of Korea Counterpart Application, Application No. 10-2021-0150899, with English translation thereof, Issued on Dec. 1, 2022, pp. 1-16.

"Office Action of Taiwan Counterpart Application" with English concise explanation, issued on Nov. 8, 2022, p. 1-p. 7.

* cited by examiner

SEMICONDUCTOR PACKAGE AND METHOD FOR MANUFACTURING THE SAME

CROSS-REFERENCE TO RELATED APPLICATIONS

This application is based on and claims priority under 35 U.S.C. § 119 to Korean Patent Application Nos. 10-2020-0150517, filed on Nov. 11, 2020, 10-2020-0158060, filed on Nov. 23, 2020 and 10-2021-0150898, filed on Nov. 4, 2021, in the Korean Intellectual Property Office, the disclosures of which are incorporated by reference herein in their entirety.

BACKGROUND

1. Field

One or more embodiments relate to a semiconductor package and a method of manufacturing the same.

2. Description of the Related Art

The storage capacity of semiconductor chips is increased and, at the same time, semiconductor packages including semiconductor chips are demanded to be thin and light. Also, researches are being conducted to include semiconductor chips of various functions in a semiconductor package and to quickly drive the semiconductor chips. In response to this trend, researches are being conducted on package-on-package (PoP) type semiconductor packages in which an upper semiconductor package is stacked on a lower semiconductor package.

SUMMARY

One or more embodiments include a thin and light weighted semiconductor package.

One or more embodiments include a semiconductor package having a redistribution line pattern formed in a fine size.

One or more embodiments include a semiconductor package with improved structural reliability.

Additional aspects will be set forth in part in the description which follows and, in part, will be apparent from the description, or may be learned by practice of the presented embodiments of the disclosure.

According to one or more embodiments, a semiconductor package includes a first semiconductor chip having a bottom surface adjacent to a first active layer and an top surface opposite to the bottom surface; a first adhesive layer disposed on the top surface of the first semiconductor chip; a first conductive stud disposed on the bottom surface of the first semiconductor chip and electrically connected to the first active layer; a first conductive post disposed outside the first semiconductor chip; a redistribution structure disposed under the first semiconductor chip and including a redistribution pattern connected to the first conductive stud and the first conductive post and a redistribution insulation layer surrounding the redistribution pattern; and a molding layer surrounding the first semiconductor chip, the first adhesive layer, the first conductive stud, and the first conductive post on the redistribution structure, wherein a top surface of the molding layer, a top surface of the conductive post, and a top surface of the first adhesive layer are coplanar.

In an example embodiment, a color of the molding layer and a color of the first adhesive layer are the same.

In an example embodiment, the top surface of the first adhesive layer includes a marking region including at least any one of information including a type, a number, performance, a manufacturing company, a logo, a manufactured date, and a serial number of the semiconductor chip.

In an example embodiment, the semiconductor package further includes a second semiconductor chip disposed under the first semiconductor chip, having a cross-sectional area in a horizontal direction smaller than a cross-sectional area of the first semiconductor chip in a horizontal direction, and having a bottom surface adjacent to a second active layer and a top surface opposite to the bottom surface; a second adhesive layer disposed between the first semiconductor chip and the second semiconductor chip; and a second conductive stud disposed on the bottom surface of a second semiconductor chip to be inside the first conductive stud and electrically connected to the second active layer, wherein the redistribution pattern of the redistribution structure is connected to the second conductive stud.

In an example embodiment, a length of the first conductive stud in a vertical direction is greater than a length of the second conductive stud in the vertical direction, and a length of the first conductive stud in the vertical direction is smaller than a length of the conductive post in the vertical direction.

In an example embodiment, the semiconductor package further includes a second semiconductor chip disposed on a side of the first semiconductor chip and having a bottom surface adjacent to the second active layer and a top surface opposite to the bottom surface; a second adhesive layer disposed on the top surface of the second semiconductor chip; and a second conductive stud disposed on the bottom surface of the second semiconductor chip and electrically connected to the second active layer, wherein a top surface of the molding layer is coplanar as a top surface of the second adhesive layer.

In an example embodiment, the semiconductor package further includes a support pad disposed on a top surface of the first adhesive layer; and a connection pad disposed on the conductive post, wherein the top surface of the molding layer, a top surface of the support pad, and a top surface of the connection pad are coplanar.

In an example embodiment, a first vertex formed as a bottom surface and a side surface of the redistribution structure meet is disposed inside a second vertex formed as a top surface and the side surface of the redistribution structure meet.

In an example embodiment, the semiconductor package further includes a passive device disposed on the redistribution structure.

According to one or more embodiments, a method of manufacturing a semiconductor package, the method includes forming conductive studs on a first side of a semiconductor substrate; forming an adhesive layer on a second surface of the semiconductor substrate opposite to the first surface; forming a first semiconductor structure including the semiconductor substrate, the conductive studs, and the adhesive layer by individualizing the semiconductor substrate; forming conductive posts on a carrier substrate; and mounting the first semiconductor structure on the carrier substrate to be surrounded by the conductive posts.

In an example embodiment, the method further includes forming a molding layer surrounding the first semiconductor structure and the conductive posts on the carrier substrate; removing at least any one of a portion of the molding layer, a portion of a conductive stud, and a portion of a conductive post such that one surface of the conductive post, one surface of the conductive stud, and one surface of the molding layer are coplanar; forming a redistribution structure on the molding layer; and removing at least a portion of the molding layer and the carrier substrate, such that one surface of the conductive post, one surface of the adhesive layer, and one surface of the molding layer are coplanar.

In an example embodiment, the method further includes forming a second semiconductor structure including the first semiconductor structure, the conductive posts, and the carrier substrate by cutting the carrier substrate; mounting the second semiconductor structure on a support substrate; forming a molding layer on the support substrate to surround the second semiconductor structure; removing the support substrate; removing at least any one of a portion of the molding layer, a portion of a conductive stud, and a portion of a conductive post such that one surface of the conductive post, one surface of the conductive stud, and one surface of the molding layer are coplanar; forming a redistribution structure on the molding layer; and removing at least a portion of the molding layer and the support substrate, such that one surface of the conductive post, one surface of the adhesive layer, and one surface of the molding layer are coplanar.

In an example embodiment, the method further includes grinding at least a portion of the carrier substrate.

In an example embodiment, the method further includes forming package connecting terminals on the redistribution structure; forming a passive device on the redistribution structure; and individualizing the semiconductor package.

Since one surface of an adhesive layer and one surface of a conductive post may be coplanar with one surface of a molding layer in a semiconductor package according to one or more embodiments, the semiconductor package may be thin and lightweighted.

Also, the semiconductor package according to one or more embodiments may include conductive studs and conductive posts connected to a redistribution line pattern, and thus the redistribution line pattern may be formed in a fine size.

Also, the semiconductor package according to one or more embodiments may include a support pad mounted on a semiconductor chip, and thus structural reliability of the semiconductor package may be improved.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
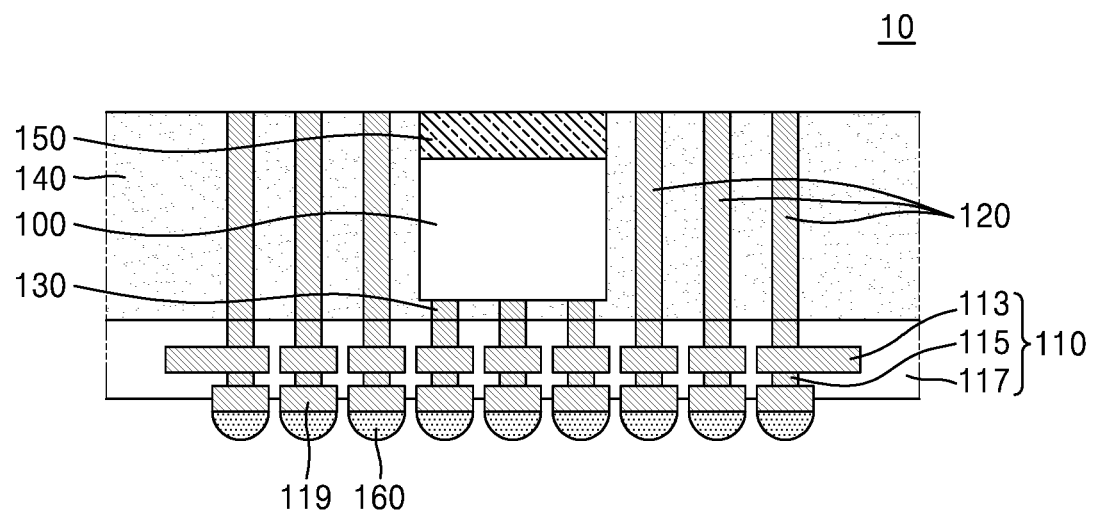
FIG. 1 is a cross-sectional view of a semiconductor package according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, one or more embodiments will be described in detail with reference to the accompanying drawings. However, one or more embodiments may be modified in various other forms, and the scope of the concept of one or more embodiments should not be construed as being limited by the embodiments described below. One or more embodiments are preferably interpreted as being provided to more fully explain the concepts of one or more embodiments to one of ordinary skill in the art. The same reference numerals denote the same elements throughout. Furthermore, various elements and regions in the drawings are schematically illustrated. Accordingly, the concept of one or more embodiments is not limited by relative sizes or spacing illustrated in the accompanying drawings.

While such terms as "first," "second," etc., may be used to describe various elements, such elements must not be limited to the above terms. The above terms may be used only to distinguish one element from another. For example, without departing from the scope of one or more embodiments, a first element may be referred to as a second element, and similarly, a second element may also be referred to as a first element.

The terms used in the present specification are merely used to describe particular embodiments, and are not intended to limit one or more embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined otherwise, all terms used herein have the same meaning as commonly understood by one of ordinary skill in the art to which the concepts of one or more embodiments belong, including technical and scientific terms. Also, commonly used terms as defined in the dictionary should be construed as having a meaning consistent with their meaning in the context of the relevant technology, and unless explicitly defined herein, it will be understood that they shall not be construed in an overly formal sense.

One or more embodiments will be described in detail with reference to the accompanying drawings.

FIG. 1 is a cross-sectional view of a semiconductor package 10 according to an example embodiment of the inventive concept.

Referring to FIG. 1, the semiconductor package 10 according to one or more embodiments may function as a lower semiconductor package in a package-on-package (PoP) type semiconductor package.

Also, the semiconductor package 10 may be a wafer level package (WLP). In an example embodiment, the semiconductor package 10 may be a fan-out wafer level package. For example, at least one of a plurality of package connecting terminals 160 included in the semiconductor package 10 may be arranged outside a semiconductor chip 100. However, the semiconductor package 10 is not limited to a wafer level package and may be a panel level package.

The semiconductor package 10 according to one or more embodiments may include the semiconductor chip 100, a redistribution structure 110, conductive posts 120, conductive studs 130, a molding layer 140, an adhesive layer 150, and package connecting terminals 160.

In an example embodiment, the semiconductor chip 100 may have a top surface and a bottom surface. For example, the top surface of the semiconductor chip 100 may be one surface of the semiconductor chip 100 in contact with the adhesive layer 150, and the bottom surface of the semiconductor chip 100 may be one surface of the semiconductor chip 100 in contact with the conductive studs 130.

Hereinafter, a horizontal direction may be defined as a direction parallel to a direction in which the top surface and the bottom surface of the semiconductor chip 100 extend (e.g., the width-wise direction of the semiconductor chip 100), and a vertical direction may be defined as a direction perpendicular to the direction in which the top surface and the bottom surface of the semiconductor chip 100 extend (e.g., the thickness-wise direction of the semiconductor chip 100).

In an example embodiment, the semiconductor chip 100 may have an active layer at a portion adjacent to the bottom surface. The active layer of the semiconductor chip 100 may include a plurality of individual devices of various types. For example, the individual devices may include various microelectronic devices, e.g., a complementary metal-oxide semiconductor (CMOS) transistor, a metal-oxide-semiconductor field effect transistor (MOSFET), a system large scale integration (LSI), an image sensor like a CMOS imaging sensor (CIS), a micro-electro-mechanical system (MEMS), an active device, a passive device, etc.

In an example embodiment, chip pads (not shown) electrically connected to the plurality of individual devices in the active layer may be arranged on the bottom surface of the semiconductor chip 100. Also, as will be described later, the chip pads of the semiconductor chip 100 may be connected to the conductive studs 130.

In an example embodiment, the redistribution structure 110 may be disposed under the semiconductor chip 100. Also, the redistribution structure 110 may include a redistribution insulation layer 117, redistribution line patterns 113 extending in the horizontal direction in the redistribution insulation layer 117, and redistribution via patterns 115 extending in the vertical direction in the redistribution insulation layer 117. Also, the redistribution line patterns 113 and the redistribution via patterns 115 may be collectively referred to as a redistribution pattern.

In an example embodiment, the redistribution insulation layer 117 may include an insulation material made of a photo imageable dielectric (PID) material ready for a photolithography process. For example, the redistribution insulation layer 117 may include photosensitive polyimide (PSPI). However, one or more embodiments are not limited thereto, and the redistribution insulation layer 117 may include an oxide or a nitride. For example, the re-wiring insulation layer 117 may include silicon oxide or silicon nitride.

In an example embodiment, materials constituting the redistribution via patterns 115 and the redistribution line patterns 113 may include copper (Cu). However, one or more embodiments are not limited thereto, and the materials constituting the redistribution via patterns 115 and the redistribution line patterns 113 may include metals like nickel (Ni), gold (Au), silver (Ag), aluminum (Al), tungsten (W), and titanium. (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru) or an alloy thereof.

In an example embodiment, the redistribution line patterns 113 and the redistribution via patterns 115 may be electrically connected to the conductive posts 120 and the conductive studs 130.

In an example embodiment, an interval between a plurality of redistribution line patterns 113 may be about 5 micrometers or less. For example, the interval between the plurality of redistribution line patterns 113 may be from about 1 micrometer to about 3 micrometers. However, the interval between the plurality of redistribution line patterns 113 is not limited thereto.

In an example embodiment, an under bump metal (UBM) 119 may contact the redistribution via pattern 115. Also, at least a portion of a side surface of the UBM 119 may be surrounded by the redistribution insulation layer 117. However, one or more embodiments are not limited thereto, and the side surface of the UBM 119 may not be surrounded by the redistribution insulation layer 117.

In an example embodiment, the bottom surface of the UBM 119 may contact the package connecting terminal 160, and the top surface of the UBM 119 may contact at least any one of the redistribution line pattern 113 and the redistribution via pattern 115. In other words, the UBM 119 may electrically connect the package connecting terminal 160, the redistribution line pattern 113, and the redistribution via pattern 115 to one another.

In an example embodiment, the conductive posts 120 may be posts of a conductive material that penetrate through the molding layer 140 in the vertical direction. For example, the conductive posts 120 may be arranged in a shape surrounding the side surface of the semiconductor chip 100.

In an example embodiment, the length of the conductive post 120 in the vertical direction may be greater than the length of the semiconductor chip 100 in the vertical direction. Also, the length of the conductive post 120 in the vertical direction may be substantially the same as the length of the molding layer 140 in the vertical direction.

In an example embodiment, the bottom surface of the conductive post 120 may contact the redistribution via pattern 115 of the redistribution structure 110. However, one or more embodiments are not limited thereto, and the top surface of the conductive post 120 may contact the redistribution line pattern 113 of the redistribution structure 110.

Also, the top surface of the conductive post 120 opposite to the bottom surface of the conductive post 120 may be exposed by the molding layer 140. Also, the top surface of the conductive post 120 and the top surface of the molding layer 140 may be coplanar. Also, the top surface of the conductive post 120 and the top surface of the adhesive layer 150 may be coplanar.

In an example embodiment, the conductive posts 120 may be arranged on the redistribution structure 110 in a zigzag shape. However, the arrangement structure of the conductive posts 120 is not limited thereto.

Also, in an example embodiment, the conductive post 120 may have a cylindrical shape or a polygonal column-like shape.

In an example embodiment, a material constituting the conductive posts 120 may include Cu. However, the material constituting the conductive posts 120 is not limited thereto, and the material constituting the conductive posts 120 may include metals like Ni, Au, Ag, Al, W, Ti, Ta, In, Mo, Mn, Co, Sn, Mg, Re, Be, Ga, and Ru, or an alloy thereof.

In an example embodiment, the conductive stud 130 may be a conductive material disposed between the semiconductor chip 100 and the redistribution structure 110. For example, the conductive studs 130 may have a cylindrical shape or a polygonal column-like shape.

In an example embodiment, the conductive studs 130 may be arranged between the semiconductor chip 100 and the redistribution structure 110 and electrically connect a plurality of individual devices in the active layer of the semiconductor chip 100 to the redistribution line pattern 113 and the redistribution via pattern 115.

In an example embodiment, the conductive studs 130 may contact chip pads (not shown) of the semiconductor chip 100. Also, the length of the conductive studs 130 in the vertical direction may be shorter than the length of the conductive posts 120 in the vertical direction.

Also, a material constituting the conductive studs 130 may include Cu. However, the material constituting the conductive studs 130 is not limited thereto, and the material constituting the conductive studs 130 may include metals like Ni, Au, Ag, Al, W, Ti, Ta, In, Mo, Mn, Co, Sn, Mg, Re, Be, Ga, and Ru, or an alloy thereof.

In an example embodiment, the molding layer 140 may be disposed on one surface of the redistribution structure 110 and surround the semiconductor chip 100, the conductive posts 120, the conductive studs 130, and the adhesive layer 150. For example, the molding layer 140 may be configured to fix the semiconductor chip 100, the conductive posts 120, and the conductive studs 130 onto the redistribution structure 110.

In an example embodiment, the molding layer 140 may form the exterior of the semiconductor package 10 together with the redistribution structure 110. For example, side surfaces of the molding layer 140 and side surfaces of the redistribution structure 110 may form side surfaces of the semiconductor package 10. Also, the top surface of the molding layer 140 may form the top surface of the semiconductor package 10. Also, the side surfaces of the molding layer 140 may be coplanar with the side surfaces of the redistribution structure 110.

In an example embodiment, the molding layer 140 may include an epoxy molding compound (EMC). However, the material constituting the molding layer 140 is not limited to the above-stated EMC and may also include various materials, e.g., an epoxy-based material, a thermosetting material, a thermoplastic material, a UV treatment material, etc.

In an example embodiment, the adhesive layer 150 may be attached on the top surface of the semiconductor chip 100. For example, the adhesive layer 150 may be a die attach film (DAF). However, the type of the adhesive layer 150 is not limited thereto.

In an example embodiment, one surface of the adhesive layer 150 may be coplanar with one surface of the molding layer 140. For example, the bottom surface of the adhesive layer 150 may be in contact with the top surface of the semiconductor chip 100, side surfaces of the adhesive layer 150 may be surrounded by the molding layer 140, and the top surface of the adhesive layer 150 may be coplanar with the top surface of the molding layer 140.

In an example embodiment, the color of the adhesive layer 150 may be substantially the same as the color of the molding layer 140. For example, both the color of the adhesive layer 150 and the color of the molding layer 140 may be black. However, the color of the adhesive layer 150 and the color of the molding layer 140 are not limited thereto.

For example, when the color of the adhesive layer 150 and the color of the molding layer 140 are the same, the interface between the adhesive layer 150 and the molding layer 140 may not be observed.

In an example embodiment, the adhesive layer 150 may include a marking region including at least any one of information regarding type, number, performance, name and/or logo of a manufacturing company, manufactured date, and serial number on the top surface of the adhesive layer 150. For example, an ink marking technique or a laser marking technique may be used for marking information on the semiconductor package 10.

Accordingly, when the semiconductor package 10 is viewed from above, the marking region may be observed on the adhesive layer 150.

In an example embodiment, the package connecting terminal 160 may be attached to the bottom surface of the redistribution structure 110 and may be a connection terminal for electrical connection between the semiconductor chip 100 and an external device.

In an example embodiment, the package connecting terminal 160 may be attached to the bottom surface of the UBM 119. Also, the package connecting terminal 160 may be a solder ball containing a metal material including at least one material from among Sn, Ag, Cu, and Al.

In an example embodiment, at least any one of the plurality of package connecting terminals 160 may be disposed outside the side surfaces of the semiconductor chip 100. Therefore, the semiconductor package 10 may be a semiconductor package having a fan-out structure.

In an example embodiment, the semiconductor package 10 may further include a passive device (not shown). For example, the passive device may be disposed under the redistribution structure 110. For example, the passive device may be disposed under the redistribution structure 110 and electrically connected to a portion of the UBM 119.

Also, the passive device may be electrically connected to the redistribution line pattern 113 and the redistribution via pattern 115 of the redistribution structure 110.

In an example embodiment, the passive device may be electrically connected to the semiconductor chip 100. Also, the passive device may perform the function of at least any one of a capacitor, an inductor, and a resistor.

The top surface of the conductive post 120, the top surface of the adhesive layer 150, and the top surface of the molding layer 140 of the semiconductor package 10 according to one or more embodiments may be coplanar, and thus the semiconductor package 10 may be thin and lightweighted.

Also, since the semiconductor package 10 according to one or more embodiments may include the conductive studs 130 and the conductive posts 120, even when the redistribution line patterns 113 and the redistribution via patterns 115 of the redistribution structure 110 are provided in fine sizes, the conductive studs 130 and the conductive posts 120 may be electrically connected to the redistribution line patterns 113 and the redistribution via patterns 115.

FIG. 4 is a cross-sectional view of a semiconductor package 20 according to one or more embodiments.

Figure 2:
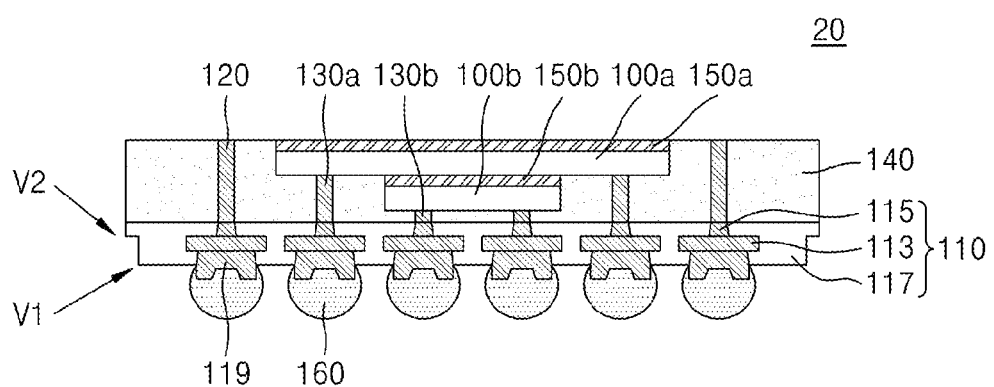
FIG. 2 is a cross-sectional view of a semiconductor package according to one or more embodiments.

Referring to FIG. 2, the semiconductor package 20 according to one or more embodiments may include a first semiconductor chip 100a, a second semiconductor chip 100b, the redistribution structure 110, the conductive posts 120, a first conductive stud 130a, a second conductive stud 130b, a molding layer 140, a first adhesive layer 150a, a second adhesive layer 150b, and the package connecting terminal 160.

Hereinafter, descriptions of the semiconductor package 20 of FIG. 2 identical to the descriptions of the semiconductor package 10 of FIG. 1 given above will be omitted, and descriptions below will mainly focus on differences therebetween.

The semiconductor package 20 may include two or more semiconductor chips 100a and 100b. The two or more semiconductor chips 100a and 100b included in the semiconductor package 20 may be semiconductor chips of the same type or semiconductor chips of different types.

In example embodiments, the semiconductor package 20 may be a system in package (SIP) in which different types of semiconductor chips and various electronic components are electrically connected to one another and operate as one system.

The first semiconductor chip 100a may be disposed over the second semiconductor chip 100b. Also, the horizontal length of the first semiconductor chip 100a may be greater than the horizontal length of the second semiconductor chip 100b.

In an example embodiment, when the semiconductor package 20 is viewed from above, a cross-sectional area of the first semiconductor chip 100a in the horizontal direction may be larger than a cross-sectional area of the second semiconductor chip 100b in the horizontal direction.

The first conductive stud 130a may be a conductive material disposed between the first semiconductor chip 100a and the redistribution structure 110. Also, the first conductive stud 130a may be disposed outside the second semiconductor chip 100b. In other words, the first conductive stud 130a may be disposed outside the second conductive stud 130b.

In an example embodiment, the first conductive stud 130a may be disposed between the first semiconductor chip 100a and the redistribution structure 110 and electrically connect a plurality of individual devices in an active layer of the first semiconductor chip 100a to the redistribution line pattern 113 and the redistribution via pattern 115.

The second conductive stud 130b may be a conductive material disposed between the second semiconductor chip 100b and the redistribution structure 110. Also, the second conductive stud 130b may be disposed inside the first conductive stud 130a.

In an example embodiment, the second conductive stud 130b may be disposed between the second semiconductor chip 100b and the redistribution structure 110 and electrically connect a plurality of individual devices in an active layer of the second semiconductor chip 100b to the redistribution line pattern 113 and the redistribution via pattern 115.

In an example embodiment, the length of the first conductive stud 130a in the vertical direction may be greater than the length of the second conductive stud 130b in the vertical direction. Also, the length of the first conductive stud 130a in the vertical direction may be shorter than the length of the conductive post 120 in the vertical direction.

In an example embodiment, the first adhesive layer 150a may be disposed on the first semiconductor chip 100a. Also, the top surface of the first adhesive layer 150a may be coplanar with the top surface of the molding layer 140. Also, side surfaces of the first adhesive layer 150a may be coplanar as side surfaces of the first semiconductor chip 100a.

In an example embodiment, the second adhesive layer 150b may be interposed between the first semiconductor chip 100a and the second semiconductor chip 100b, thereby fixing the first semiconductor chip 100a onto the second semiconductor chip 100b. Also, side surfaces of the second adhesive layer 150b may be coplanar as side surfaces of the second semiconductor chip 100b.

The top surface of the molding layer 140, the top surface of the first adhesive layer 150a, and the top surface of the conductive post 120 of the semiconductor package 20 according to one or more embodiments may be coplanar, and thus the semiconductor package 20 may be thin and light-weighted.

In an example embodiment, the redistribution structure 110 may have a tapered shape in which the length in the horizontal direction decreases toward the package connecting terminal 160.

For example, when a cross-section of the semiconductor package 20 is viewed, the redistribution structure 110 may have an inverted trapezoidal shape. Also, the length of the top surface of the redistribution structure 110 in the horizontal direction may be smaller than the length of the bottom surface of the redistribution structure 110 in the horizontal direction.

For example, when a cross-section of the redistribution structure 110 is viewed, a first vertex V1 formed as the bottom surface and a side surface of the redistribution structure 110 meet may be located inside a second vertex V2 formed as the top surface and the side surface of the redistribution structure 110 meet.

The top surface of the redistribution structure 110 may be one surface of the redistribution structure 110 adjacent to the molding layer 140, and the bottom surface of the redistribution structure 110 may be one surface of the redistribution structure 110 adjacent to an external connection terminal 250.

Figure 3:
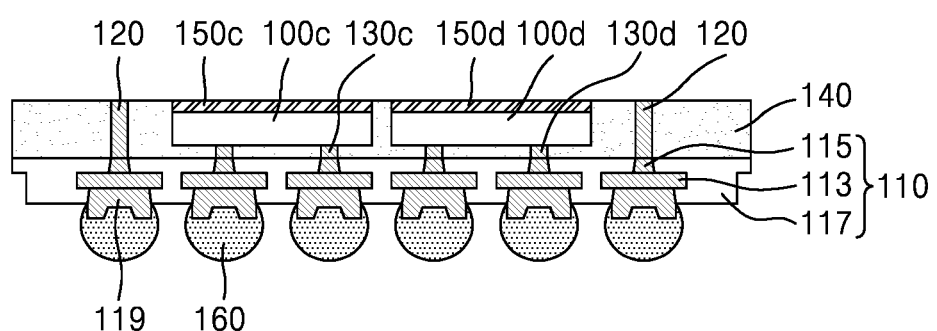
FIG. 3 is a cross-sectional view of a semiconductor package according to one or more embodiments.

FIG. 3 is a cross-sectional view of a semiconductor package 30. According to according to an example embodiment of the inventive concept.

Referring to FIG. 3, the semiconductor package 30 according to one or more embodiments may include a first semiconductor chip 100c, a second semiconductor chip 100d, the redistribution structure 110, the conductive post 120, a first conductive stud 130c, a second conductive stud 130d, the molding layer 140, a first adhesive layer 150c, a second adhesive layer 150d, and the package connecting terminal 160.

Hereinafter, descriptions of the semiconductor package 30 of FIG. 3 identical to the descriptions of the semiconductor package 10 of FIG. 1 given above will be omitted, and descriptions below will mainly focus on differences therebetween.

The first semiconductor chip 100c and the second semiconductor chip 100d may be arranged to be spaced apart from each other in the horizontal direction. Also, the length of the first semiconductor chip 100c in the vertical direction and the length of the second semiconductor chip 100d in the vertical direction may be substantially the same. However, one or more embodiments are not limited thereto, and the length of the first semiconductor chip 100c in the vertical direction and the length of the second semiconductor chip 100d in the vertical direction may differ.

The first conductive stud 130c may be a conductive material disposed between the first semiconductor chip 100c and the redistribution structure 110. Also, the first conductive stud 130c may be disposed between the first semiconductor chip 100c and the redistribution structure 110 and electrically connect a plurality of individual devices in an active layer of the first semiconductor chip 100c to the redistribution line pattern 113 and the redistribution via pattern 115.

The second conductive stud 130d may be a conductive material disposed between the second semiconductor chip 100d and the redistribution structure 110. Also, the second conductive stud 130d may be disposed between the second semiconductor chip 100d and the redistribution structure 110 and electrically connect a plurality of individual devices in an active layer of the second semiconductor chip 100d to the redistribution line pattern 113 and the redistribution via pattern 115.

In an example embodiment, the length of the first conductive stud 130c in the vertical direction may be substantially the same as the length of the second conductive stud 130d in the vertical direction. Also, the length of the first conductive stud 130c in the vertical direction and the length of the second conductive stud 130d in the vertical direction may be smaller than the length of the conductive post 120 in the vertical direction.

In an example embodiment, the first adhesive layer 150c may be disposed on the first semiconductor chip 100c, and the second adhesive layer 150d may be disposed on the second semiconductor chip 100d. Also, the top surface of the first adhesive layer 150c, the top surface of the second adhesive layer 150d, and the top surface of the molding layer 140 may be coplanar.

The top surface of the molding layer 140, the top surface of the first adhesive layer 150c, the top surface of the second adhesive layer 150d, and the top surface of the conductive post 120 of the semiconductor package 30 according to one or more embodiments may be coplanar, and thus the semiconductor package 30 may be thin and lightweighted.

Hereinafter, a method of manufacturing a semiconductor package according to one or more embodiments will be described with reference to FIGS. 4A to 6I. In detail, the method of manufacturing the semiconductor package according to one or more embodiments may be a method of manufacturing the semiconductor package 10 described above with reference to FIG. 1.

The method of manufacturing the semiconductor package 10 according to one or more embodiments may include forming a first semiconductor structure (ST1 of FIG. 4E), forming a second semiconductor structure (ST2 of FIG. 5F) including the first semiconductor structure ST1, and manufacturing the semiconductor package 10 by using the second semiconductor structure ST2.

FIGS. 4A to 4E are diagrams showing respective operations of a method of manufacturing the first semiconductor structure ST1 (FIG. 4E) according to one or more embodiments.

Figure 4A:
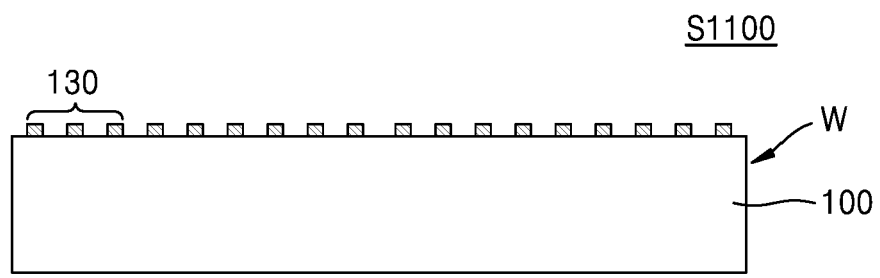
FIGS. 4A to 4E are diagrams showing respective operations of a method of manufacturing a first semiconductor structure according to one or more embodiments.

Referring to FIG. 4A, the method of manufacturing the semiconductor package 10 according to one or more embodiments may include operation S1100 of forming the conductive studs 130 on a semiconductor substrate W on which a plurality of semiconductor chips are formed.

In an example embodiment, an active layer including a plurality of individual devices may be formed in a portion of the semiconductor substrate W adjacent to the top surface of the semiconductor substrate W. For example, the semiconductor substrate W may be a wafer on which the active layer is formed. Also, the semiconductor substrate W may include a plurality of semiconductor chips 100 each having an active layer, and an individualized semiconductor substrate W may be defined as the semiconductor chip 100.

In an example embodiment, the conductive studs 130 may be formed on the top surface of the semiconductor chip 100. For example, the conductive studs 130 may be arranged on the top surface of the semiconductor chip 100 to contact chip pads (not shown) of the semiconductor chip 100.

Figure 4B:
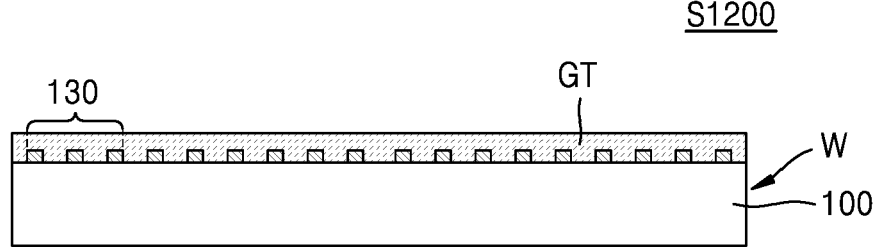

Referring to FIG. 4B, the method of manufacturing the semiconductor package 10 according to one or more embodiments may include operation S1200 of removing a portion of the semiconductor substrate W.

In an example embodiment, a grinding tape GT may be attached on the top of the structure of FIG. 4A. For example, the length of the grinding tape GT in the vertical direction provided in operation S1200 may be greater than the length of the conductive studs 130 in the vertical direction. Therefore, the grinding tape GT may be disposed on the structure of FIG. 4A and cover the conductive studs 130.

In an example embodiment, after the grinding tape GT is disposed on the semiconductor substrate W and covers the conductive studs 130, at least a portion of the semiconductor substrate W may be removed. For example, the lower portion of the semiconductor substrate W may be removed through a grinding process. Therefore, the length of the semiconductor substrate W in the vertical direction may be reduced.

Figure 4C:
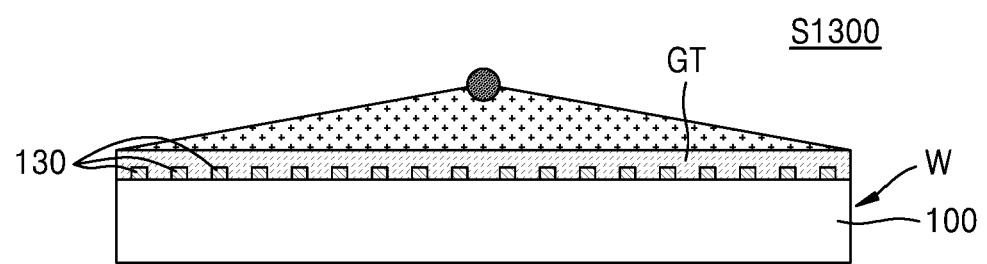

Referring to FIG. 4C, the method of manufacturing the semiconductor package 10 according to one or more embodiments may include operation S1300 of removing the grinding tape GT.

In an example embodiment, the grinding tape GT may include a material that reacts with light. For example, in operation S1300, when light is provided to the grinding tape GT, the adhesive force between the grinding tape GT and the semiconductor substrate W may be weakened due to a chemical reaction of the grinding tape GT to the light.

Figure 4D:
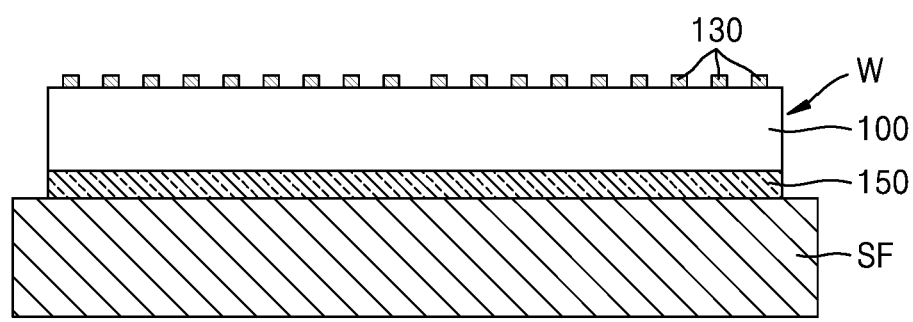

Referring to FIG. 4D, the method of manufacturing the semiconductor package 10 according to one or more embodiments may include operation S1400 of attaching the adhesive layer 150 and a cutting film SF to the lower portion of the semiconductor substrate W.

In an example embodiment, the adhesive layer 150 may be interposed between the semiconductor substrate W and the cutting film SF. Also, when the structure of FIG. 4D is viewed from above, a cross-sectional area of the cutting film SF in the horizontal direction may be larger than a cross-sectional area of the adhesive layer 150 in the horizontal direction.

Figure 4E:
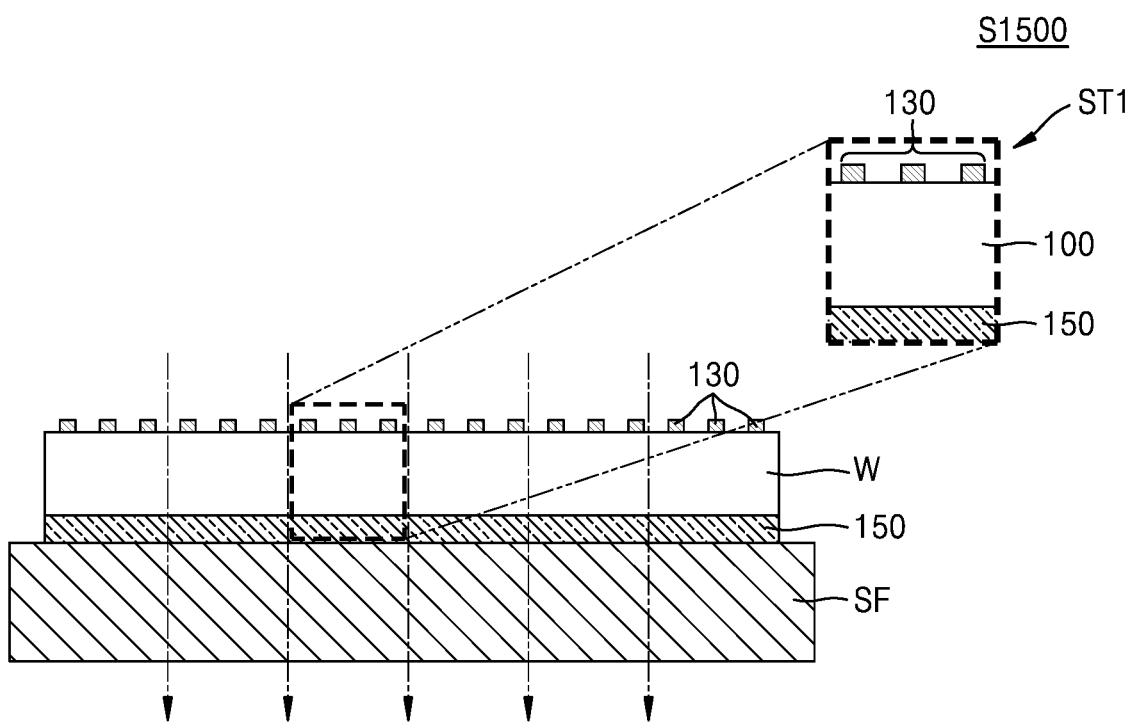

Referring to FIG. 4E, the method of manufacturing the semiconductor package 10 according to one or more embodiments may include operation S1500 of forming the first semiconductor structure ST1 by individualizing the structure of FIG. 4D.

In an example embodiment, operation S1500 may include sawing scribe lanes of the semiconductor substrate W, and individualizing the semiconductor substrate W by stretching the cutting film SF.

By performing operations S1100 to S1500, the first semiconductor structure ST1 including the semiconductor chip 100, the conductive studs 130, and the adhesive layer 150 may be manufactured.

FIGS. 5A to 5F are diagrams showing respective operations of a method of manufacturing the second semiconductor structure ST2 (FIG. 5F) according to one or more embodiments. The second semiconductor structure ST2 according to one or more embodiments may be manufactured by using the above-described first semiconductor structure ST1.

Figure 5A:
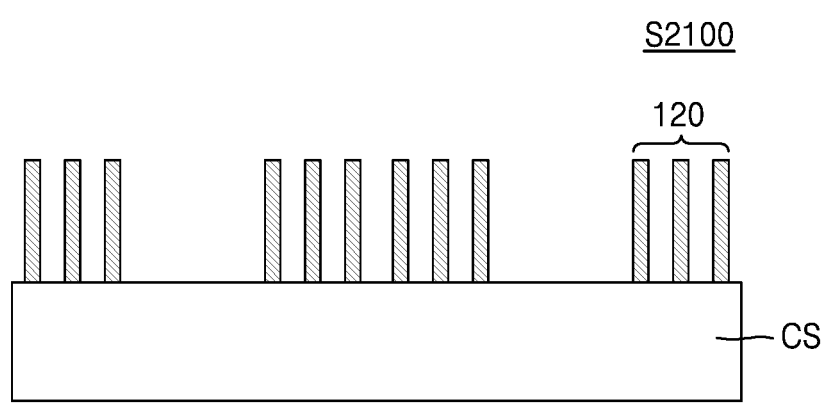
FIGS. 5A to 5F are diagrams showing respective operations of a method of manufacturing a second semiconductor structure according to one or more embodiments.

Referring to FIG. 5A, the method of manufacturing the semiconductor package 10 according to one or more embodiments may include operation S2100 of forming the conductive posts 120 on a carrier substrate CS.

In an example embodiment, the length of the carrier substrate CS in the vertical direction may be from about 700 micrometers to about 800 micrometers. For example, the length of the carrier substrate CS in the vertical direction may be about 780 micrometers. However, the length of the carrier substrate CS in the vertical direction is not limited thereto.

For example, the carrier substrate CS may be a wafer. However, one or more embodiments are not limited thereto, and the carrier substrate CS may include at least one of a glass substrate, GFS, ceramic, and an epoxy molding compound (EMC).

In an example embodiment, after an operation of forming a seed layer (not shown) including a conductive material through a photoresist process on the carrier substrate CS, an operation of forming the conductive posts 120 on the carrier substrate CS may be performed.

Also, in an example embodiment, after an operation of sequentially forming an adhesive layer, a polymer layer, and a seed layer including a conductive material on the carrier substrate CS, an operation of forming the conductive posts 120 on the carrier substrate CS may be performed.

Also, in an example embodiment, after a redistribution structure (not shown) is formed on the carrier substrate CS, an operation of forming the conductive posts 120 on the redistribution structure may be performed.

Figure 5B:
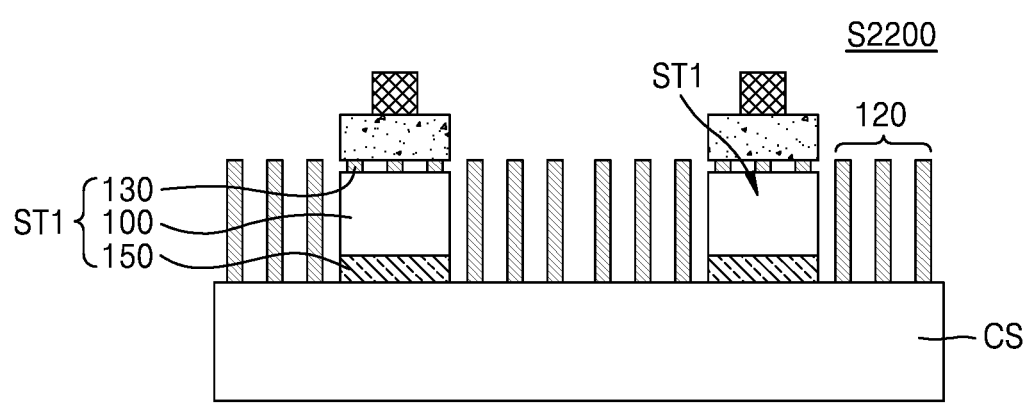

Referring to FIG. 5B, the method of manufacturing the semiconductor package 10 according to one or more embodiments may include operation S2200 of mounting the first semiconductor structure ST1 on the carrier substrate CS.

In an example embodiment, the semiconductor chip 100 may be attached to the carrier substrate CS through the adhesive layer 150. For example, the semiconductor chip 100 may be attached to the carrier substrate CS, such that side surfaces of the semiconductor chip 100 are surrounded by the conductive posts 120.

In an example embodiment, the semiconductor chip 100 may be attached to the carrier substrate CS through a bonding device and a heating chuck. At this time, the heating chuck may heat the adhesive layer 150 to a temperature from about 30 degrees to about 80 degrees. For example, the heating chuck may heat the adhesive layer 150 to a temperature of about 60 degrees.

Figure 5C:
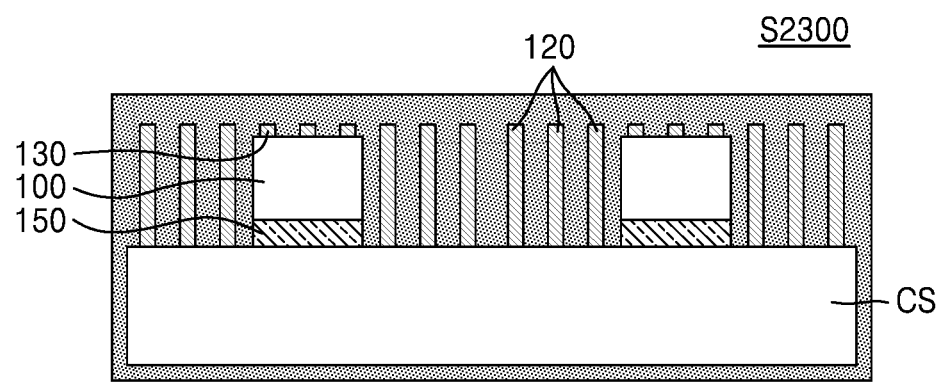

Referring to FIG. 5C, the method of manufacturing the semiconductor package 10 according to one or more embodiments may include operation S2300 of heating the structure of FIG. 5B.

In an example embodiment, operation S2300 may include an operation of heating the structure of FIG. 5B to a temperature from about 150 degrees to about 200 degrees. For example, in operation S2300, the structure of FIG. 5B may be heated to a temperature of about 175 degrees for about 1 hour. Therefore, the semiconductor chip 100 may be firmly fixed onto the carrier substrate CS by the adhesive layer 150.

Figure 5D:
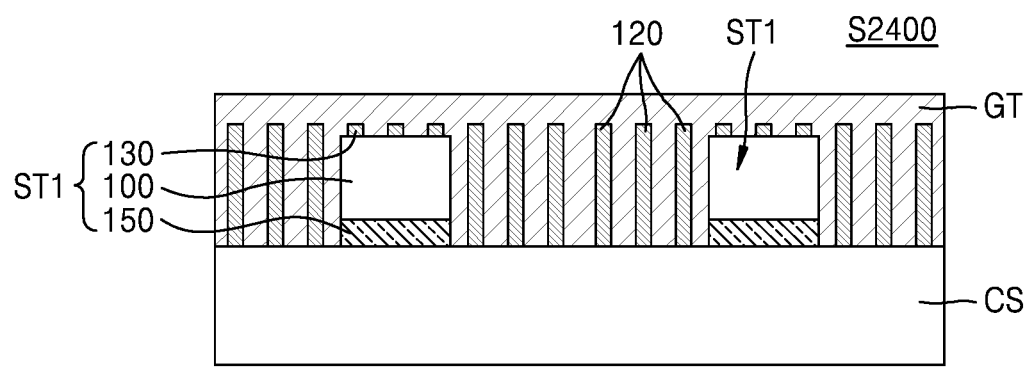

Referring to FIG. 5D, the method of manufacturing the semiconductor package 10 according to one or more embodiments may further include operation S2400 of attaching the grinding tape GT onto the carrier substrate CS.

In an example embodiment, the length of the grinding tape GT in the vertical direction may be greater than the lengths of the first semiconductor structure ST1 and the conductive post 120 in the vertical direction.

In an example embodiment, the grinding tape GT may be disposed on the carrier substrate CS and cover the first semiconductor structure ST1 and the conductive post 120.

Figure 5E:
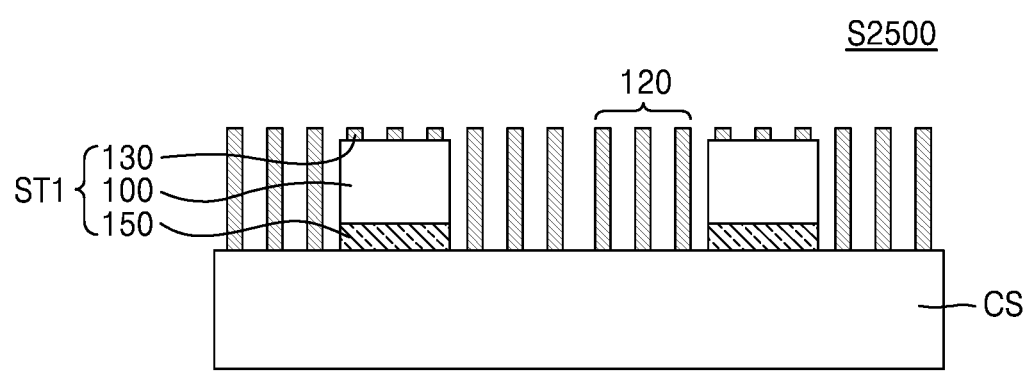

Referring to FIG. 5E, the method of manufacturing the semiconductor package 10 according to one or more embodiments may include operations S2400 of grinding at least a portion of the carrier substrate CS.

In an example embodiment, a portion of the carrier substrate CS may be removed through a grinding process. The length of the carrier substrate CS in the vertical direction after the grinding process may be from about 300 micrometers to about 500 micrometers. For example, the length of the carrier substrate CS in the vertical direction after the grinding process may be about 335 micrometers.

In an example embodiment, after the grinding process of the carrier substrate CS is performed, the grinding tape GT may be removed.

Figure 5F:
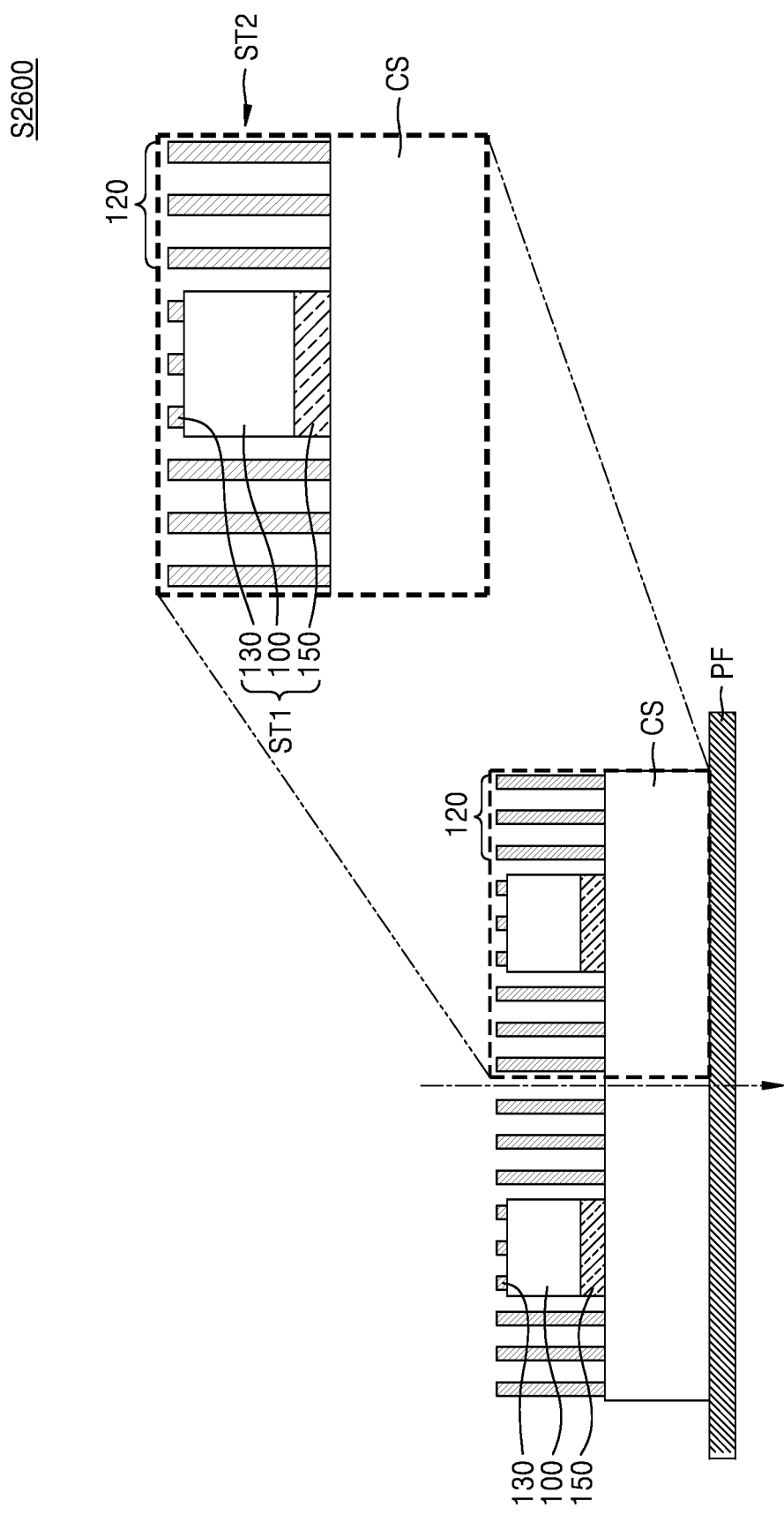

Referring to FIG. 5F, the method of manufacturing the semiconductor package 10 according to one or more embodiments may include operation S2600 of forming the second semiconductor structure ST2 by individualizing the structure of FIG. 5E.

Before operation S2600 is performed, a cutting film PF may be attached onto the lower portion of the carrier substrate CS. For example, the cutting film PF may be attached onto the carrier substrate CS through an adhesive layer (not shown).

In an example embodiment, operation S2600 may include an operation of cutting along the scribe lanes of the carrier substrate CS and an operation of pulling the cutting film SF attached onto the lower portion of the carrier substrate CS.

Also, to form the second semiconductor structure ST2 to have a predetermined height, at least a portion of the carrier substrate CS may be removed. For example, a portion of the carrier substrate CS may be ground or debonded.

Through the operations of FIGS. 5A to 5F, the second semiconductor structure ST2 including the carrier substrate CS, the first semiconductor structure ST1, and the conductive post 120 may be manufactured. In detail, through the operations of FIGS. 5A to 5F, the second semiconductor structure ST2 including the carrier substrate CS, the semiconductor chip 100, the conductive studs 130, the adhesive layer 150, and the conductive posts 120 may be manufactured.

FIGS. 6A to 6I are diagrams showing operations of the method of manufacturing the semiconductor package 10 according to one or more embodiments, respectively. The semiconductor package 10 according to one or more embodiments may be manufactured by using the above-described second semiconductor structure ST2.

Figure 6A:
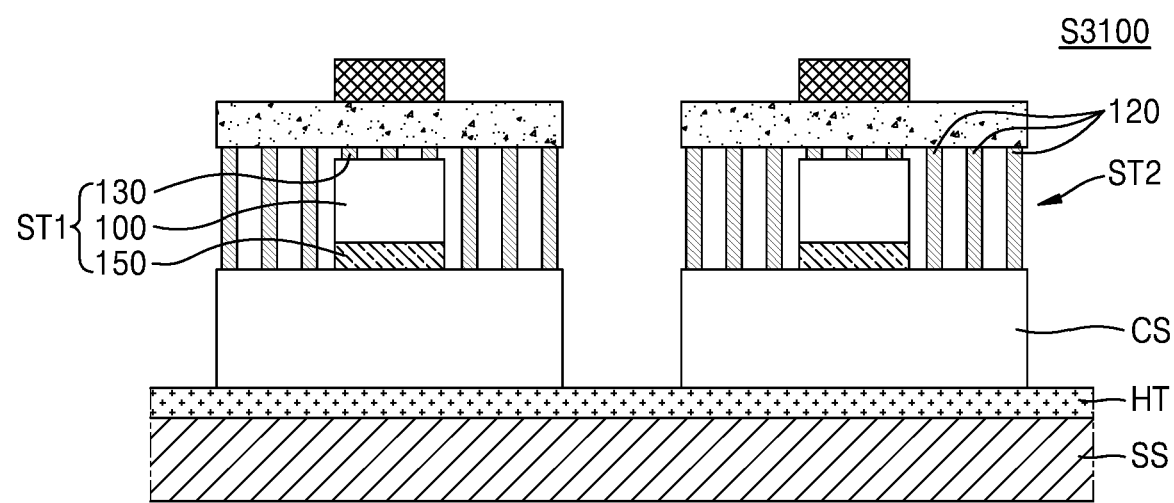
FIGS. 6A to 6I are diagrams showing operations of the method of manufacturing a semiconductor package according to one or more embodiments, respectively.

Referring to FIG. 6A the method of manufacturing the semiconductor package 10 according to one or more embodiments may include operation S3100 of mounting the second semiconductor structure ST2 on a support substrate SS.

For example, the support substrate SS may be a carrier substrate or a panel including a metal material. However, one or more embodiments are not limited thereto, and the support substrate SS may include at least one of glass, GFS, an EMC, silicon, and ceramic.

In operation S3100, a tape HT reacting to heat may be attached onto the support substrate SS. For example, the tape HT may be a tape having relatively strong adhesiveness at the room temperature and relatively weak adhesiveness at a high temperature.

In an example embodiment, a plurality of second semiconductor structures ST2 may be attached onto the support substrate SS by the tape HT.

Figure 6B:
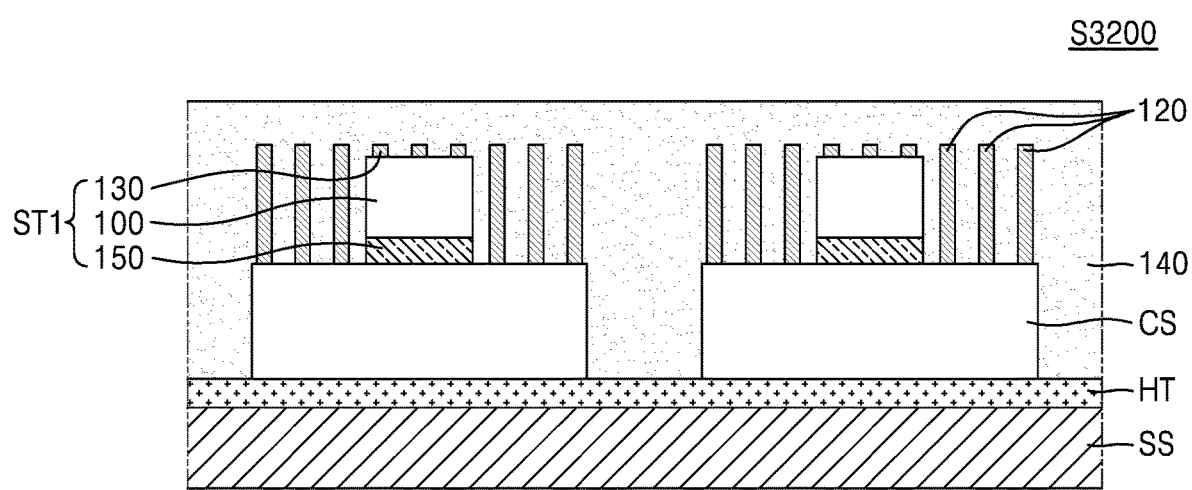

Referring to FIG. 6B, the method of manufacturing the semiconductor package 10 according to one or more embodiments may include operation S3200 of forming the molding layer 140 on the support substrate SS.

In an example embodiment, the molding layer 140 may be disposed on the support substrate SS and cover the carrier substrate CS, the semiconductor chip 100, the conductive posts 120, the conductive studs 130, and the adhesive layer 150. Therefore, after operation S3200 is performed, the carrier substrate CS, the semiconductor chip 100, the conductive posts 120, the conductive studs 130, and the adhesive layer 150 may not be exposed to the outside.

Figure 6C:
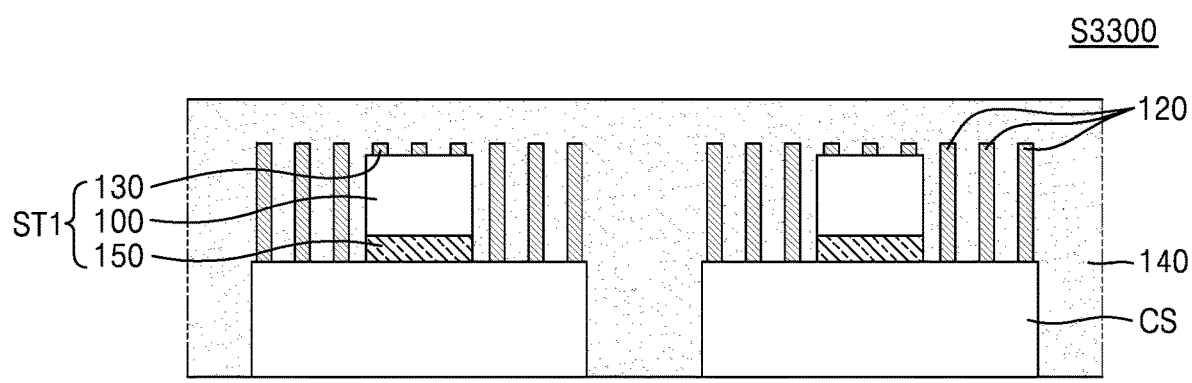

Referring to FIG. 6C, the method of manufacturing the semiconductor package 10 according to one or more embodiments may include operation S3300 of removing the support substrate SS.

In an example embodiment, in operation S3300, an operation of providing heat to the tape HT may be performed. When heat is applied to the tape HT, the adhesiveness between the support substrate SS and the molding layer 140 is reduced, and thus the support substrate SS may be separated from the carrier substrate CS.

Figure 6D:
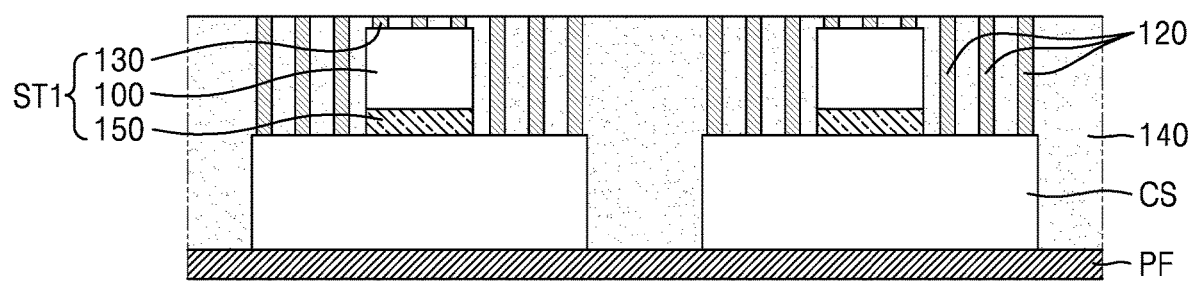

Referring to FIG. 6D, the method of manufacturing the semiconductor package 10 according to one or more embodiments may include operation S3400 of removing at least any one of a portion of the molding layer 140, a portion of the conductive post 120, and a portion of the conductive stud 130, such that one surface of the conductive post 120, one surface of the conductive stud 130, one surface of the molding layer 140 are coplanar.

Before operation S3400 is performed, a protective film PF may be attached onto the lower portion of the carrier substrate CS. The protective film PF may be a film having stability during a process of grinding the molding layer 140.

In an example embodiment, a portion of the molding layer 140 may be removed until one surface of the conductive post 120 and one surface of the conductive stud 130 are exposed from the molding layer 140.

However, one or more embodiments are not limited thereto, and the structure of FIG. 6C may be attached on a main carrier substrate (not shown) having a cross-sectional area in the horizontal direction greater than a cross-sectional area of the structure of FIG. 6C in the horizontal direction.

For example, the structure of FIG. 6C may be attached onto the main carrier substrate through an adhesive layer attached in advance to the lower portion of the structure of FIG. 6C. However, one or more embodiments are not limited thereto, and the structure of FIG. 6C may be attached to the main carrier substrate through an adhesive layer attached to the main carrier substrate in advance.

In an example embodiment, the main carrier substrate may include a wafer, a glass substrate, a printed circuit board (PCB), an EMC, a GFS, ceramic, epoxy, PI, Basalt, etc. However, the type of the main carrier substrate is not limited thereto.

In an example embodiment, after a plurality of structures of FIG. 6C are attached onto the main carrier substrate, a separate additional molding layer may be formed on the main carrier substrate. The additional molding layer may be configured to fix the plurality of the structures of FIG. 6C onto the main carrier substrate.

Thereafter, a process of removing the molding layer 140 and the additional molding layer may be performed until one surface of the conductive post 120 and one surface of the conductive stud 130 are exposed from the molding layer 140.

Therefore, the plurality of structures of FIG. 6C may be attached onto the main carrier substrate, and thus a subsequent operation of forming the redistribution structure 110 (operation S3500) may be performed in large quantities.

Figure 6E:
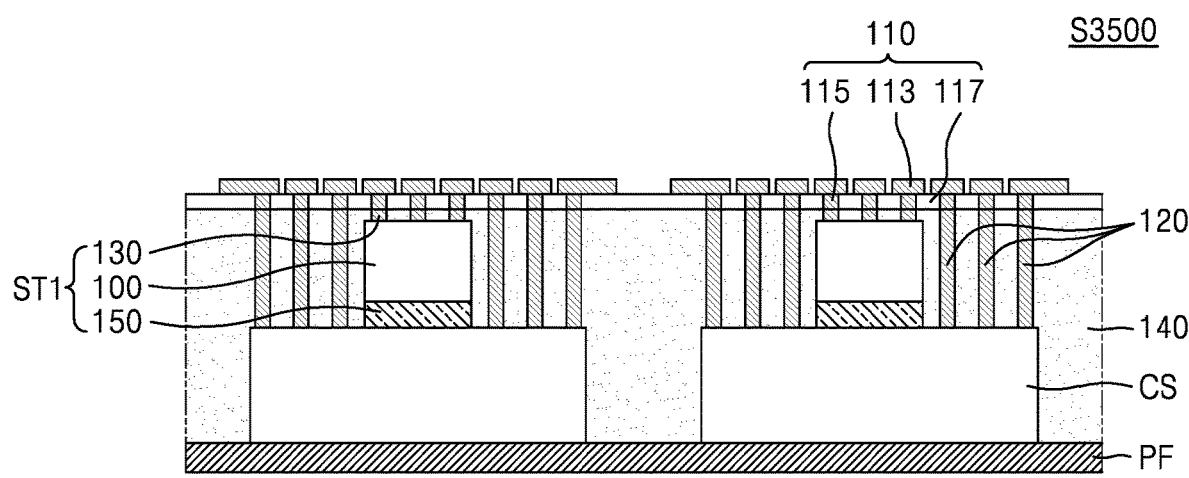

Referring to FIG. 6E, the method of manufacturing the semiconductor package 10 according to one or more embodiments may include operation S3500 of forming the redistribution structure 110.

In an example embodiment, operation S3500 may include an operation of forming the redistribution insulation layer 117 on the molding layer 140, an operation of forming the redistribution via pattern 115 to be connected to the conductive posts 120 and the conductive studs 130, and an operation of forming the redistribution line pattern 113 to be connected to the redistribution via pattern 115.

In an example embodiment, in operation S3500, the redistribution line pattern 113 may be formed by a plurality of layers extending in the horizontal direction. However, one or more embodiments are not limited thereto, and the redistribution line pattern 113 may be formed as a single layer.

Figure 6F:
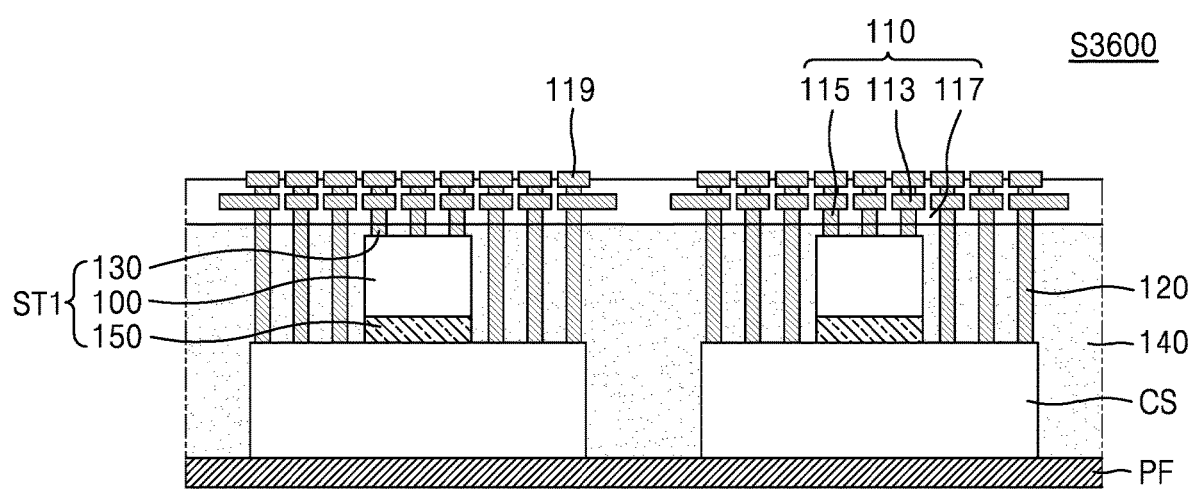

Referring to FIG. 6F, the method of manufacturing the semiconductor package 10 according to one or more embodiments may include operation S3600 of forming the UBM 119 on the redistribution structure 110.

In an example embodiment, operation S3600 of forming the UBM 119 may include an operation of forming a UBM seed layer (not shown) on the redistribution structure 110 and an operation of forming the UBM 119 through a plating process using the UBM seed layer.

Figure 6G:
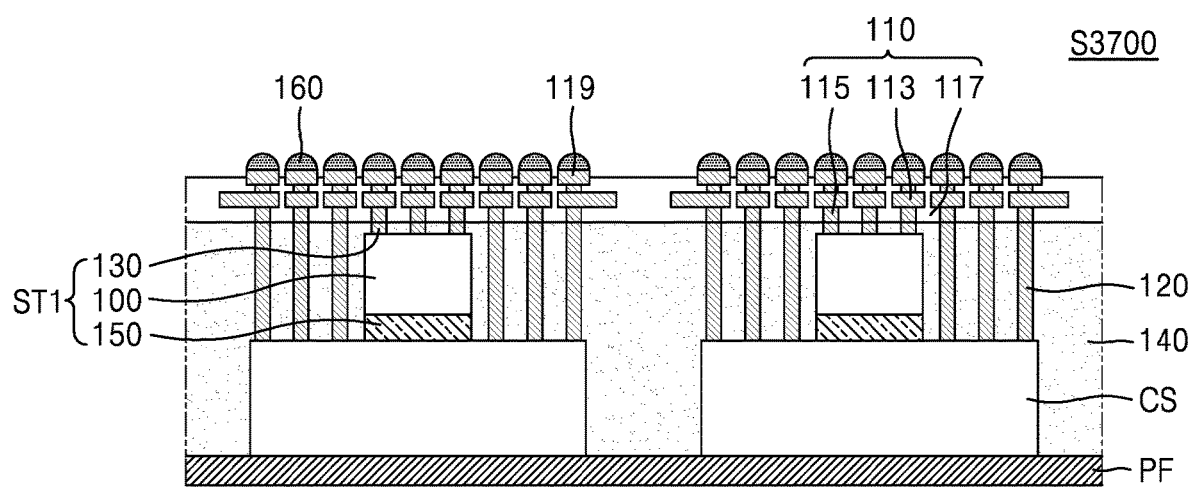

Referring to FIG. 6G, the method of manufacturing the semiconductor package 10 according to one or more embodiments may include operation S3700 of attaching the package connecting terminal 160 onto the UBM 119.

In an example embodiment, the package connecting terminal 160 may be attached onto a surface of the UBM 119 through a soldering process.

However, one or more embodiments are not limited thereto, and, in the method of manufacturing the semiconductor package 10 according to one or more embodiments, operation S3600 of forming the UBM 119 may be omitted. In this case, the package connecting terminal 160 may be connected to the redistribution line pattern 113 and the redistribution via pattern 115.

In an example embodiment, the method of manufacturing the semiconductor package 10 according to one or more embodiments may further include an operation of forming a passive device on the redistribution structure 110. For example, the operation of forming the passive device may be performed simultaneously with an operation of forming the package connecting terminal 160. However, one or more embodiments are not limited thereto, and the operation of forming the passive device may be performed before or after the operation of forming the package connecting terminal 160.

Figure 6H:
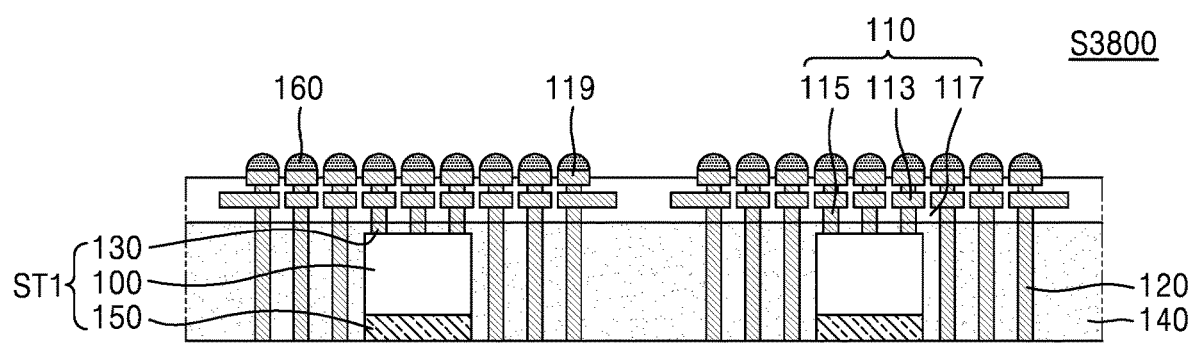

Referring to FIG. 6H, the method of manufacturing the semiconductor package 10 according to one or more embodiments may include operation S3800 of removing at least portions of the carrier substrate CS and the molding layer 140.

In an example embodiment, in operation S3800, one surface of the adhesive layer 150 may function as a stopper during an operation of grinding the carrier substrate CS and the molding layer 140.

In an example embodiment, at least portions of the carrier substrate CS and the molding layer 140 may be ground until one surface of the adhesive layer 150 and one surface of the conductive post 120 are exposed from the molding layer 140.

In an example embodiment, after operation S3800 is performed, one surface of the adhesive layer 150, one surface of the conductive post 120, and one surface of the molding layer 140 may be coplanar.

Figure 6I:
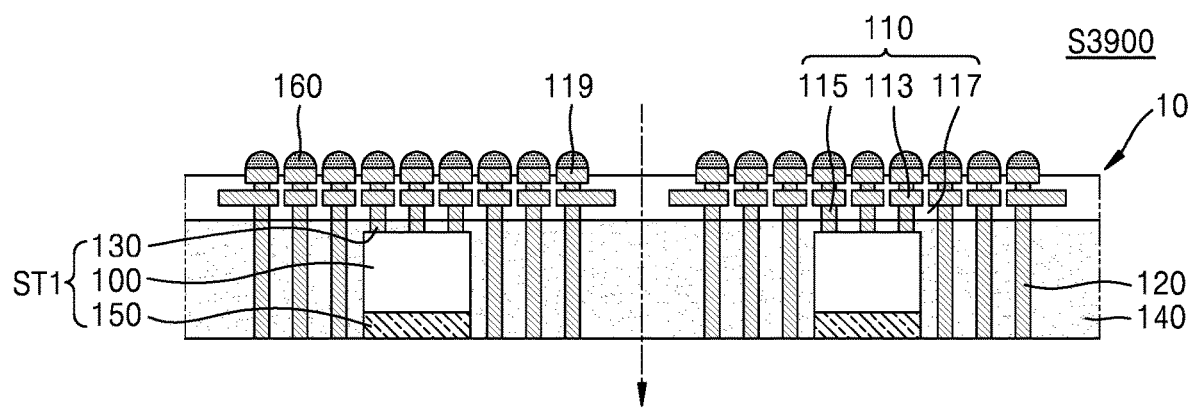

Referring to FIG. 6I, the method of manufacturing the semiconductor package 10 according to one or more embodiments may include operation S3900 of forming the semiconductor package 10 by individualizing the structure of FIG. 6H.

In an example embodiment, the redistribution insulation layer 117 of the redistribution structure 110 and the molding layer 140 of the structure of FIG. 6H may be cut, and thus a plurality of semiconductor packages 10 may be individualized.

Figure 7:
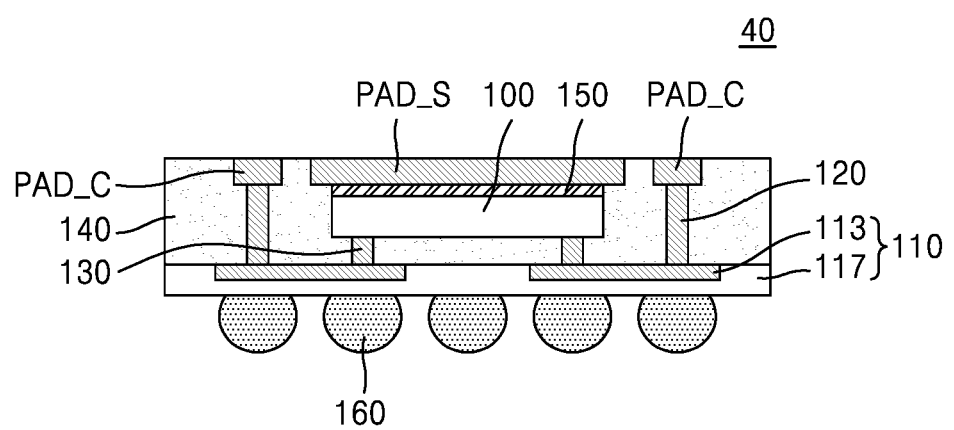
FIG. 7 is a cross-sectional view of a semiconductor package according to one or more embodiments.

FIG. 7 is a cross-sectional view of a semiconductor package 40. According to according to an example embodiment of the inventive concept.

Referring to FIG. 7, the semiconductor package 40 according to one or more embodiments may include the semiconductor chip 100, the redistribution structure 110, the conductive posts 120, the conductive studs 130, a support pad PAD_S, connection pads PAD_C, the molding layer 140, the adhesive layer 150, and the package connecting terminal 160.

Hereinafter, descriptions of the semiconductor package 40 of FIG. 7 identical to the descriptions of the semiconductor package 10 of FIG. 1 given above will be omitted, and descriptions below will mainly focus on differences therebetween.

The support pad PAD_S may be mounted on the semiconductor chip 100 by the adhesive layer 150. In an example embodiment, when the semiconductor package 40 is viewed from above, the cross-sectional area of the support pad PAD_S may be larger than that of the semiconductor chip 100. However, one or more embodiments are not limited thereto, and side surfaces of the support pad PAD_S may be coplanar as side surfaces of the semiconductor chip 100.

The support pad PAD_S may include a metal material (e.g., Cu). Also, the material constituting the support pad PAD_S may be substantially the same as that of the conductive posts 120.

However, one or more embodiments are not limited thereto, and the material constituting the support pad PAD_S may include an insulation material (e.g., an EMC). Also, the material constituting the support pad PAD_S may be substantially the same as that of the molding layer 140 to be described later.

Since the support pad PAD_S may be mounted on the semiconductor chip 100, the support pad PAD_S may prevent physical damage to the semiconductor chip 100 due to an external impact.

In an example embodiment, the top surface of the support pad PAD_S may be coplanar with the top surface of the molding layer 140. Also, the side surfaces of the support pad PAD_S may be surrounded by the molding layer 140.

The conductive posts 120 may pass through at least a portion of the molding layer 140. Also, the bottom surface of the conductive post 120 may contact the redistribution line pattern 113 of the redistribution structure 110, and the top surface of the conductive post 120 may contact the connection pad PAD_C.

In an example embodiment, the length of the conductive posts 120 in the vertical direction may be smaller than the length of the molding layer 140 in the vertical direction.

The connection pad PAD_C may be disposed on one surface of the conductive post 120. The connection pad PAD_C may be a pad that electrically connects a semiconductor chip included in a separate semiconductor package mounted on the connection pad PAD_C to the conductive post 120.

In an example embodiment, the connection pad PAD_C may include a metal material (e.g., Cu). Also, the material constituting the connection pad PAD_C may be substantially the same as that of the conductive posts 120.

In an example embodiment, the top surface of the connection pad PAD_C may be coplanar with the top surface of the molding layer 140. Also, the side surfaces of the connection pad PAD_C may be surrounded by the molding layer 140.

In an example embodiment, the length of the connection pad PAD_C in the horizontal direction may be greater than the length of the conductive post 120 in the horizontal direction. However, one or more embodiments are not limited thereto, and the length of the connection pad PAD_C in the horizontal direction may be substantially the same as the length of the conductive post 120 in the horizontal direction or may be smaller than the length of the conductive post 120 in the horizontal direction.

Since the semiconductor package 40 according to one or more embodiments may include the support pad PAD_S disposed on the semiconductor chip 100, the structural reliability of the semiconductor package 40 may be improved.

Also, since the top surface of the support pad PAD_S of the semiconductor package 40 according to one or more embodiments is exposed from the molding layer 140 and the support pad PAD_S may include a material having excellent thermal conductivity (e.g., Cu), the heat dissipation performance of the semiconductor package 40 may be improved.

Hereinafter, a method of manufacturing the semiconductor package 40 according to one or more embodiments will be described in detail. FIGS. 8A to 8D are diagrams showing operations of the method of manufacturing the semiconductor package 40 according to one or more embodiments, respectively.

Figure 8A:
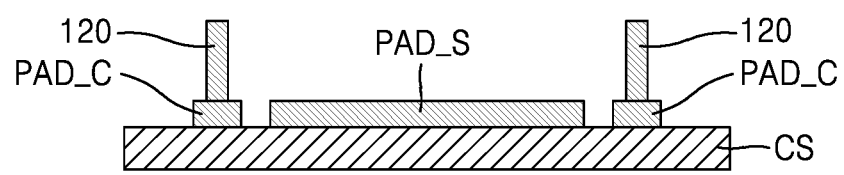
FIGS. 8A to 8D are diagrams showing operations of the method of manufacturing a semiconductor package according to one or more embodiments, respectively.

Referring to FIG. 8A, the method of manufacturing a semiconductor package 40 according to one or more embodiments may include an operation of forming the support pad PAD_S and the connection pads PAD_C on the support substrate SS and operation S5100 of forming the conductive posts 120 on the connection pads PAD_C.

In an example embodiment, the carrier substrate CS may be a silicon substrate or a glass fiber substrate. However, the type of the carrier substrate CS is not limited thereto.

In an example embodiment, the support pad PAD_S may be disposed at the center portion of the carrier substrate CS, and the connection pads PAD_C may be arranged at edge portions of the carrier substrate CS. For example, the connection pads PAD_C may be arranged at edge portions of the carrier substrate CS to surround sides of the support pad PAD_S.

Figure 8B:
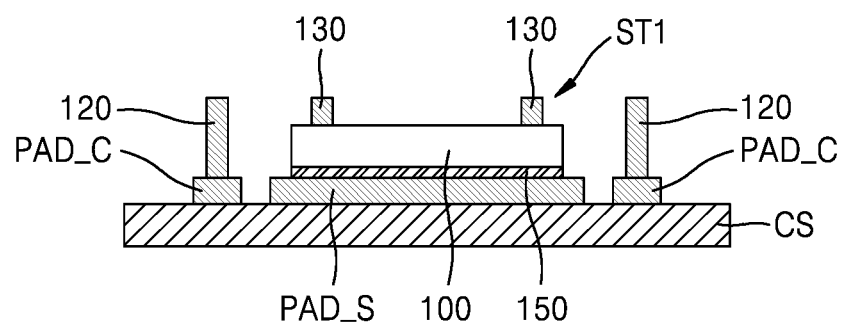

Referring to FIG. 8B, the method of manufacturing the semiconductor package 40 according to one or more embodiments may include operation S5200 of mounting the first semiconductor structure ST1 on the support pad PAD_S.

The first semiconductor structure ST1 may include the semiconductor chip 100, the conductive studs 130, and the adhesive layer 150. Since descriptions of the first semiconductor structure ST1 is identical to the descriptions given above with reference to FIGS. 4A to 4E, detailed descriptions thereof will be omitted.

In an example embodiment, the first semiconductor structure ST1 may be firmly fixed onto the surface of the support pad PAD_S by the adhesive layer 150.

Figure 8C:
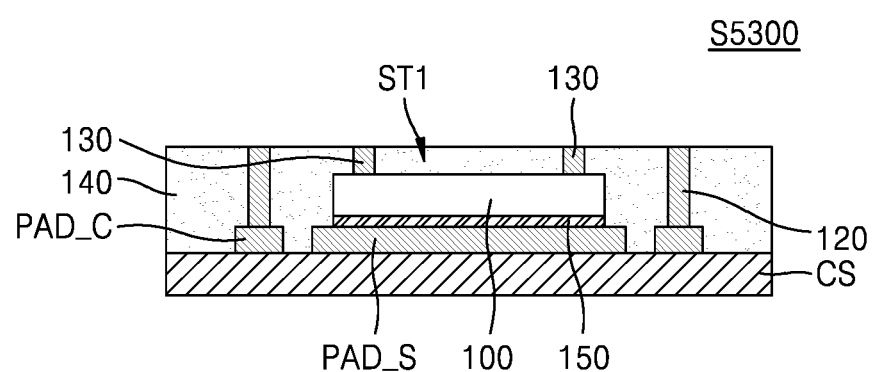

Referring to FIG. 8C, the method of manufacturing the semiconductor package 40 according to one or more embodiments may include operation S5300 of forming the molding layer 140 on the carrier substrate CS.

In an example embodiment, operation S5300 may include an operation of forming the molding layer 140 on the carrier substrate CS to surround the connection pads PAD_C, the support pad PAD_S, and the first semiconductor structure ST1 and an operation of removing at least a portion of the molding layer 140 to expose one surface of the conductive post 120 and one surface of the conductive stud 130 from the molding layer 140.

Figure 8D:
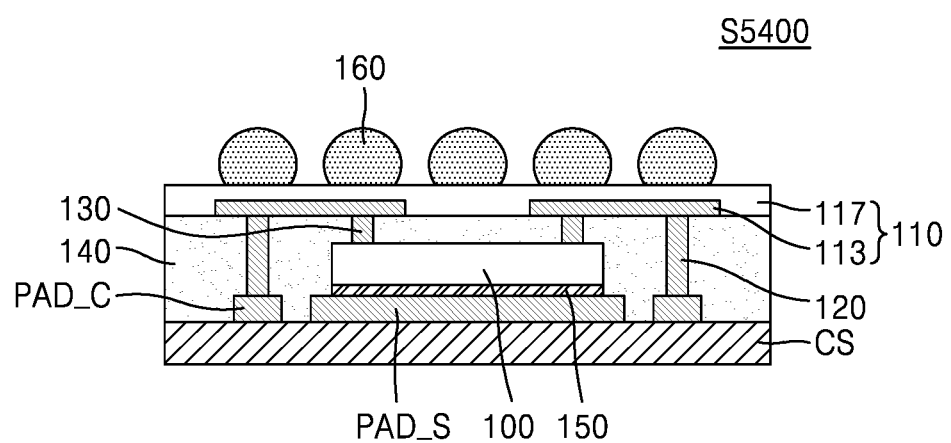

Referring to FIG. 8D, the method of manufacturing the semiconductor package 40 according to one or more embodiments may include operation S5400 of forming the redistribution structure 110 and the package connecting terminals 160.

In an example embodiment, operation S5400 may include an operation of forming the redistribution insulation layer 117 on the molding layer 140, an operation of forming the redistribution line pattern 113 to be connected to the conductive posts 120 and the conductive studs 130, and an operation of forming the package connecting terminals 160 on the redistribution structure 110.

In an example embodiment, in operation S5400, the redistribution line pattern 113 may be formed by a plurality of layers extending in the horizontal direction. However, one or more embodiments are not limited thereto, and the redistribution line pattern 113 may be formed as a single layer.

After operation S5400 is performed, the carrier substrate CS may be removed from the molding layer 140. Therefore, the semiconductor package 40 according to one or more embodiments may be manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A semiconductor package comprising:
a first semiconductor chip having a bottom surface adjacent to a first active layer and a top surface opposite to the bottom surface;
a first adhesive layer disposed on the top surface of the first semiconductor chip;
a first conductive stud disposed on the bottom surface of the first semiconductor chip and electrically connected to the first active layer;
a first conductive post disposed outside the first semiconductor chip;
a redistribution structure disposed under the first semiconductor chip and comprising a redistribution pattern connected to the first conductive stud and the first conductive post and a redistribution insulation layer surrounding the redistribution pattern;
a molding layer surrounding the first semiconductor chip, the first adhesive layer, the first conductive stud, and the first conductive post on the redistribution structure,
a second semiconductor chip disposed under the first semiconductor chip, having a cross-sectional area in a horizontal direction smaller than a cross-sectional area of the first semiconductor chip in the horizontal direction, and having a bottom surface adjacent to a second active layer and a top surface opposite to the bottom surface;
a second adhesive layer disposed between the first semiconductor chip and the second semiconductor chip;
a second conductive stud disposed on the bottom surface of the second semiconductor chip to be inside the first conductive stud as seen in a cross-sectional view and electrically connected to the second active layer;
a support pad disposed on a top surface of the first adhesive layer; and
a connection pad disposed on the first conductive post,
wherein the redistribution pattern of the redistribution structure is connected to the second conductive stud,
wherein the first conductive stud includes a portion that overlaps the second conductive stud and the first conductive post along the horizontal direction, and
wherein a top surface of the molding layer, a top surface of the support pad, and a top surface of the connection pad are coplanar, and a bottom surface of the support pad is coplanar with the top surface of the first adhesive layer.

2. The semiconductor package of claim 1, wherein the first conductive stud includes a portion that overlaps the second semiconductor chip along the horizontal direction.

3. The semiconductor package of claim 1, wherein the top surface of the first adhesive layer comprises a marking region comprising at least any one of information comprising a type, a number, performance, a manufacturing company, a logo, a manufactured date, and a serial number of the first semiconductor chip.

4. The semiconductor package of claim 1,
wherein a length of the first conductive stud in a vertical direction is greater than a length of the second conductive stud in the vertical direction,
a length of the first conductive stud in the vertical direction is smaller than a length of the first conductive post in the vertical direction, and
wherein the first conductive post includes a first portion overlapping the first semiconductor chip and a second portion overlapping the second semiconductor chip along the horizontal direction.

5. The semiconductor package of claim 1, further comprising:
- a third semiconductor chip disposed on a side of the first semiconductor chip and having a bottom surface adjacent to a third active layer and a top surface opposite to the bottom surface;
- a third adhesive layer disposed on the top surface of the third semiconductor chip; and
- a third conductive stud disposed on the bottom surface of the third semiconductor chip and electrically connected to the third active layer,
- wherein the top surface of the molding layer is coplanar with a top surface of the third adhesive layer.

6. The semiconductor package of claim 1, wherein a first vertex formed as a bottom surface and a side surface of the redistribution structure meet is disposed inside a second vertex formed as a top surface and the side surface of the redistribution structure meet.

\* \* \* \* \*